(12) United States Patent
Yap et al.

(10) Patent No.: US 9,698,104 B2
(45) Date of Patent: Jul. 4, 2017

(54) INTEGRATED ELECTRONIC PACKAGE AND STACKED ASSEMBLY THEREOF

(71) Applicant: FREESCALE SEMICONDUCTOR, INC., Austin, TX (US)

(72) Inventors: Weng F. Yap, Chandler, AZ (US); Michael B. Vincent, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/182,547

(22) Filed: Jun. 14, 2016

(65) Prior Publication Data

US 2016/0293551 A1 Oct. 6, 2016

Related U.S. Application Data

(62) Division of application No. 14/321,261, filed on Jul. 1, 2014, now Pat. No. 9,396,999.

(51) Int. Cl.
*H01L 23/538* (2006.01)
*H01L 21/56* (2006.01)
(Continued)

(52) U.S. Cl.
CPC ........ *H01L 23/5389* (2013.01); *H01L 21/561* (2013.01); *H01L 21/568* (2013.01); *H01L 21/78* (2013.01); *H01L 23/13* (2013.01); *H01L 23/147* (2013.01); *H01L 23/315* (2013.01); *H01L 23/3128* (2013.01); *H01L 23/49816* (2013.01); *H01L 23/49822* (2013.01); *H01L 23/49827* (2013.01); *H01L 23/5383* (2013.01); *H01L 23/5384* (2013.01); *H01L 24/19* (2013.01); *H01L 24/96* (2013.01); *H01L 25/065* (2013.01); *H01L 25/0655* (2013.01); *H01L 25/0657* (2013.01); *H01L 25/105* (2013.01); *H01L 25/50* (2013.01); *H01L 2224/04105* (2013.01); *H01L 2224/12105* (2013.01);
(Continued)

(58) Field of Classification Search
CPC ............. H01L 23/5383; H01L 23/5384; H01L 23/49827
See application file for complete search history.

(56) References Cited

U.S. PATENT DOCUMENTS 7,950,144 B2  5/2011  Ramanathan et al.
2007/0210427 A1  9/2007  Lytle et al.
(Continued)

*Primary Examiner* — Dung Le
(74) *Attorney, Agent, or Firm* — Charlene R. Jacobsen

(57) ABSTRACT

A wafer level packaging method entails providing electronic devices and providing a platform structure having cavities extending through the platform structure. The platform structure is mounted to a temporary support. One or more electronic devices are placed in the cavities with an active side of each electronic device facing the temporary support. The platform structure and the electronic devices are encapsulated in an encapsulation material to produce a panel assembly. Redistribution layers may be formed over the panel assembly, after which the panel assembly may be separated into a plurality of integrated electronic packages. The platform structure may be formed from a semiconductor material, and platform segments within each package provide a fan-out region for conductive interconnects, as well as provide a platform for a metallization layer and/or for forming through silicon vias.

15 Claims, 11 Drawing Sheets

(51) Int. Cl.
*H01L 21/78* (2006.01)
*H01L 23/00* (2006.01)
*H01L 23/13* (2006.01)
*H01L 23/14* (2006.01)
*H01L 23/498* (2006.01)
*H01L 25/065* (2006.01)
*H01L 23/31* (2006.01)
*H01L 25/10* (2006.01)
*H01L 25/00* (2006.01)

(52) U.S. Cl.
CPC ...... *H01L 2224/18* (2013.01); *H01L 2224/19* (2013.01); *H01L 2225/1035* (2013.01); *H01L 2225/1041* (2013.01); *H01L 2225/1058* (2013.01); *H01L 2225/1064* (2013.01); *H01L 2924/19105* (2013.01); *H01L 2924/3511* (2013.01)

(56) References Cited

U.S. PATENT DOCUMENTS

| | | |
|---|---|---|
| 2010/0013081 A1 | 1/2010 | Toh et al. |
| 2011/0127654 A1* | 6/2011 | Weng ............ H01L 21/568 257/660 |
| 2013/0256884 A1 | 10/2013 | Meyer |
| 2014/0239497 A1* | 8/2014 | Yap ............ H01L 23/5384 257/738 |

* cited by examiner

20

70

80

110

238

240

US 9,698,104 B2

INTEGRATED ELECTRONIC PACKAGE AND STACKED ASSEMBLY THEREOF

TECHNICAL FIELD OF THE INVENTION

The present invention relates generally to integrated electronic packages. More specifically, the present invention relates to wafer level packaging for integrated electronic packages.

BACKGROUND OF THE INVENTION

Semiconductor and other types of electronic devices are commonly encapsulated wholly or partly in plastic resin (i.e., mold compound) to form an integrated electronic package (also referred to as an integrated circuit, IC, chip, or microchip). The plastic resin encapsulation material provides environmental protection and facilitates connection between such integrated electronic packages and external circuits. Electrical contacts for connection with external circuits are exposed at an exterior surface of an integrated electronic package and are connected internally with electrical contact pads on a semiconductor chip or die within the package. Various techniques are available for internally connecting the embedded electronic devices with the exposed electrical contacts of the integrated electronic package.

One technique for connecting the exposed electrical contacts with electrical contact pads on, for example, a semiconductor die entails temporarily placing singulated semiconductor dies with their active side on a support. The dies are embedded with a molding compound to form a comparatively flat or planar panel assembly, which is subsequently released from the temporary support. The contact pads on the semiconductor die surfaces are then connected to exposed pads on the exterior surface of the panel assembly by a redistribution process to appropriately route the signal connections, and the power and ground connections. The redistribution process (also referred to as a buildup process) includes deposition of a plurality of electrically conductive layers by electroplating techniques and patterning using batch process lithography. The electrically conductive layers are separated by insulating layers.

In certain types of electronic device packaging, a problem, referred to as "warping," can occur during the encapsulation and formation of the panel assembly. If the panel assembly has warped during encapsulation, the process of adding the electrically conductive layers using the redistribution process can be adversely affected, thereby reducing overall yield and increasing manufacturing costs. As such, control or elimination of warping is important to achieving high manufacturing yields and low manufacturing costs in such encapsulated planar assemblies.

An embedded ground plane (EGP) is sometimes built into a panel assembly. The EGP is used to limit warpage of the panel assembly, control die drift, and can also be used to provide a single routing option for ground in a finished semiconductor package. Typically, such EGP's are fabricated from copper. Unfortunately, the use of a copper EGP can lead to relatively high manufacturing and tooling costs, undesirably high rate of saw blade wear during package singulation due to material hardness, and high thermal expansion.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

DETAILED DESCRIPTION

A method of wafer level packaging and integrated electronic packages produced via the wafer level packaging methodology are provided. More particularly, a panel assembly of electronic devices is fabricated that includes an embedded platform structure formed of a semiconductor material. The embedded platform structure serves to limit warpage of the panel assembly during encapsulation relative to a panel assembly made of mold compound in order to increase package yield and decrease manufacturing complexity during a subsequent build up process. Furthermore, the incorporation of a platform structure, such as a silicon wafer, can reduce material costs as well as manufacturing and tooling costs, and can reduce saw blade wear rate during package singulation relative to the use of a copper EGP. Additionally, the implementation of an embedded platform structure, such as a semiconductor wafer, in the panel assembly can achieve reduced thermal expansion, hence better die drift performance, relative to the use of a copper EGP. And still further, the platform structure embedded in the panel assembly can be used as a platform for additional electronic circuits and/or for forming through silicon vias.

Figure 1:
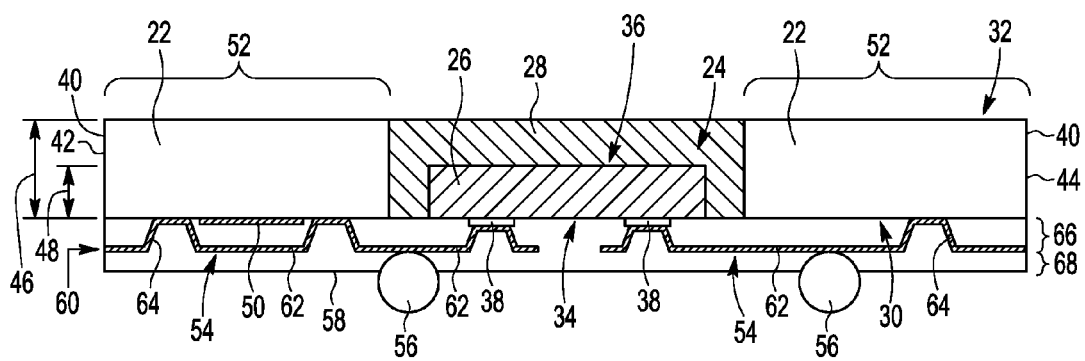
FIG. 1 shows a cross-sectional side view of an integrated electronic package in accordance with an embodiment.

FIG. 1 shows a cross-sectional side view of an integrated electronic package 20 in accordance with an embodiment. Integrated electronic package 20 includes a platform segment 22 having a cavity 24 extending through platform segment 22. Integrated electronic package 20 further includes an electronic device 26 and encapsulation material 28 residing in cavity 24. Encapsulation material 28 fills cavity 24 and couples electronic device 26 to platform segment 22.

In the illustrated configuration, platform segment 22 has a first surface 30, and a second surface 32, opposing first surface 30. Electronic device 26 has an active side 34 and a back side 36 opposing active side 34. Electrical contacts 38 are located at active side 34 of electronic device 26. In general, active side 34 of electronic device 26 and electrical contacts 38 are approximately coplanar with first surface 30 of platform segment 22. Electrical contacts 38 are shown extending above active side 34 of electronic device 26 for visibility in the illustrated configuration of FIG. 1. Electrical contacts 38 need not extend above active side 34, but may instead be coplanar with active side 34. The terms "first," "second," and so forth are used for distinguishing between similar elements and not necessarily for describing a particular sequential or chronological order.

Active side 34 of electronic device 26 having electrical contacts 38 (i.e., bond pads) are exposed from encapsulation material 28. Additionally, first and second surfaces 30, 32 of platform segment 22 are exposed from encapsulation material 28. Likewise, portions 40 of platform segment 22 are exposed from encapsulation material 28 at opposing side walls 42, 44 of integrated electronic package 20.

Typically, a semiconductor wafer is used in the fabrication of integrated circuits and other microdevices. The wafer typically serves as the substrate for microelectronic devices built in and over the semiconductor wafer. In accordance with an embodiment, platform segment 22 is a portion of a semiconductor wafer that serves in an anti-warpage capacity during fabrication. That is, platform segment 22 is preferably formed from a semiconductor material having a coefficient of thermal expansion (CTE) of approximately 10 ppm/° C. (parts-per-million per degree centigrade) or less, and that contains particles or grains of around five microns or less in size. In some embodiments, platform segment 22 may be formed from a silicon crystal semiconductor wafer. However, alternative semiconductor materials may be utilized to form platform segment 22. These alternative semiconductor materials include, for example, indium antimonide, indium arsenide, gallium antimonide, indium phosphide, gallium arsenide, gallium nitride, germanium, gallium phosphide, silicon carbide, and other crystalline materials suitable for use in the electronics industry.

Thermal expansion is the tendency of matter to change in volume in response to a change in temperature through heat transfer. The CTE is defined as the degree of expansion divided by the change in temperature. A prior art copper EGP has a relatively high CTE of about 16.6 ppm/° C., whereas, silicon has a CTE of about 2.6-3.5 ppm/° C., and encapsulation material 28 has a CTE of about 10 ppm/° C. An arrangement that includes platform segment 22 formed from silicon in lieu of some of the encapsulation material 28 in integrated electronic package 20 achieves a significantly lower CTE than prior art designs. A lower CTE can limit warpage of the semiconductor wafer during fabrication, as will be discussed below.

Platform segment 22 exhibits a thickness 46 between first and second surfaces 30, 32. In some embodiments, the semiconductor wafer used to produce platform segment 22 is selected to have thickness 46 that is at least equivalent to a height 48 of electronic device 26 between active side 34 and back side 36. Thickness 46 is sufficient to provide stiffening capability in a panel assembly in order to control panel warpage during the manufacture of package 20, as will be discussed in greater detail below. In the illustrated embodiment, thickness 46 is greater than height 48 of electronic device 26. Accordingly, back side 36 of electronic device 26 is embedded in encapsulation material 28 to secure device 26 to platform segment 22 and to provide environmental protection to electronic device 26. In alternative embodiments, however, electronic device 26 may be thicker than platform segment 22. In such a case, second surface 32 of platform segment 22 may be embedded in encapsulation material.

Due to its material composition (e.g., semiconductor material), platform segment 22 may also include a metallization layer 50 formed directly on a non-cavity area 52 of platform segment 22, in order to gain greater efficiencies in scale and device complexity of integrated electronic package 20. In the illustrated example, metallization layer 50 is formed on first surface 30 of platform segment 22 as an M0 (metal zero) layer and may encompass one or more conductive traces in accordance with a particular design. However, some embodiments may additionally or alternatively include integrated circuits formed directly on the semiconductor material.

Electronic device 26 is generally any type of electronic device that may or may not be in chip form. Accordingly, such other types of devices including the non-limiting examples given below, are intended to be included in the terms "device," "electronic device," "electronic circuitry" whether singular or plural. Furthermore the terms "device," "die, and "chip" are intended to be substantially equivalent. Non-limiting examples of suitable devices are semiconductor integrated circuits, individual semiconductor devices, piezoelectric devices, magnetoresistive devices, solid state filters, magnetic tunneling structures, integrated passive devices such as capacitors, resistors and inductors, electrical interconnects, and combinations and arrays of any and all of these types of devices and elements. Further, the present invention does not depend upon the types of die or chips or devices being used. Nor does the present invention depend upon the materials of which the die or chips or devices are constructed provided that such materials can withstand the encapsulation and subsequent buildup processes.

With continued reference to FIG. 1, electrical interconnects 54 extend from electrical contacts 38 on active side 34 of electronic device 26 to conductive elements 56 exposed on an exterior surface 58 of integrated electronic package 20. More particularly, electrical interconnects 54 may be formed from an electrically conductive layer 60 suitably patterned to produce traces 62 and vias 64 that extend through a layered arrangement of insulating dielectric layers 66, 68 to interconnect with conductive elements 56, which may be solder balls, at exterior surface 58 of integrated electronic package 20.

Patterning of electrically conductive layer 60 (sometimes referred to as a metal layer or a metallization layer) to produce traces 62 and vias 64 enables an array or arrays of electrical contacts 38 on active side 34 of electronic device 26 to be redistributed geometrically, so that the array of conductive elements 56 at exterior surface 58 may have a different geometry from the geometry of electrical contacts 38 on electronic device 26. In this example, exterior surface 58 of integrated electronic package 20 is the exposed exterior of the outermost dielectric layer, i.e., dielectric layer 68.

It should be noted that conductive elements 56 are not necessarily directly aligned with electrical contacts 38, and may instead be displaced laterally so that traces 62, vias 64, and/or conductive elements 56 are aligned with (i.e., underlie or overlie) non-cavity area 52 of platform segment 22. As shown in FIG. 1, integrated electronic package 20 is formed utilizing a packaging technique that enables a fan-out design (i.e., redistribution) of conductive elements 56 and interconnect routing.

Only one cavity 24 and one electronic device 26 are shown in FIG. 1 for simplicity of illustration. Additionally, the exemplary integrated electronic package 20 shown in FIG. 1 and the integrated electronic packages shown in FIGS. 2-4 include only a few electrical contacts, conductive elements, electrical interconnects, and dielectric layers for simplicity of illustration. It should be appreciated that an integrated electronic package, such as those illustrated herein, may include any combination and quantity of cavities 24 and electronic devices 26 and any combination of electrical contacts, conductive elements, electrical interconnects, and dielectric layers in accordance with a particular device design.

Figure 2:
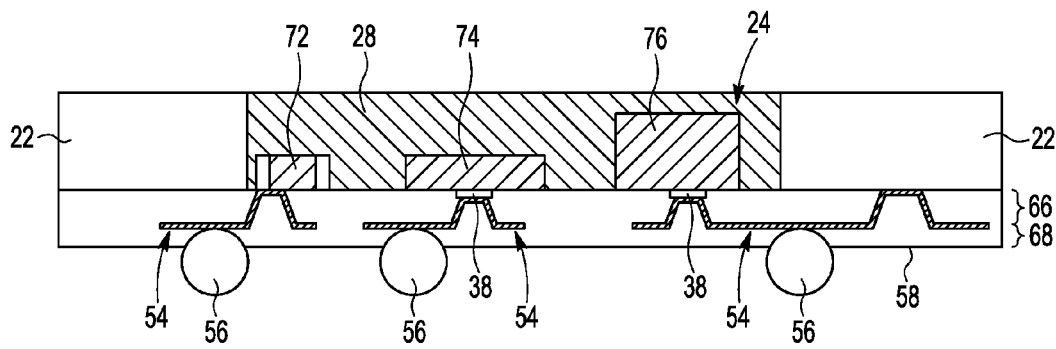
FIG. 2 shows a cross-sectional side view of an integrated electronic package in accordance with another embodiment.

FIG. 2 shows a cross-sectional side view of an integrated electronic package 70 in accordance with another embodiment. Integrated electronic package 70 can include components similar to those described in connection with integrated electronic package 20 (FIG. 1). For example, integrated electronic package 70 includes platform segment 22 and cavity 24 extending through platform segment 22. However, this example includes multiple electronic devices 72, 74, 76 residing in cavity 24 and embedded in encapsulation material 28. Additionally, integrated electronic package 70 can include corresponding electrical contacts 38 on electronic devices 72, 74, 76, conductive elements 56 exposed on exterior surface 58 of integrated electronic package 70, and electrical interconnects 54 routed through dielectric layers 66, 68. Accordingly, the example of FIG. 2 is provided to demonstrate that cavity 24 can include more than one electronic device along with associated electrical contacts, conductive elements, and electrical interconnects in accordance with a particular device design.

Figure 3:
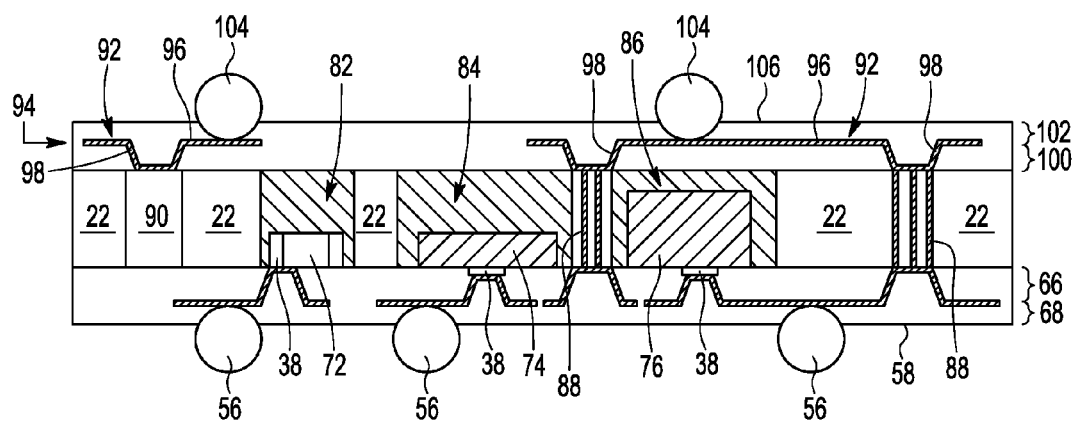
FIG. 3 shows a cross-sectional side view of an integrated electronic package in accordance with another embodiment.

FIG. 3 shows a cross-sectional side view of an integrated electronic package 80 in accordance with another embodiment. Integrated electronic package 80 includes platform segment 22 having multiple cavities 82, 84, 86 extending through platform segment 22. In this example, electronic device 72 resides in cavity 82, electronic device 74 resides in cavity 84, and electronic device 76 resides in cavity 86. Additionally, integrated electronic package 80 can include corresponding electrical contacts 38 on electronic devices 74, 76, conductive elements 56 exposed on exterior surface 58 of integrated electronic package 80, and electrical interconnects 54 routed through dielectric layers 66, 68.

With continued reference to FIG. 3, integrated electronic package 80 further includes through-silicon vias (TSV) 88 and a through-package via (TPV) 90. Each of TSV 88 and TPV 90 extend through platform segment 22 to conductive interconnects 92. Conductive interconnects 92 are formed from an electrically conductive layer 94 that is suitably patterned to produce traces 96 and vias 98 that extend through a layered arrangement of insulating dielectric layers 100, 102 to interconnect with conductive elements 104 (e.g., surface mount elements) at an exterior surface 106, opposing exterior surface 58, of integrated electronic package 80. In this example, exterior surface 106 of integrated electronic package 80 is the exposed exterior of the outermost dielectric layer, i.e., dielectric layer 102.

TSV 88 and TPV 90 are considered complementary three dimensional packaging enablers, where TSV 88 enables fine geometry (for example, approximately ten micron diameter) and TPV 90 enables coarse geometry (for example, approximately one hundred to two hundred micron diameter). TSV 88 is a vertical electrical connection (where the term "via" typically refers to Vertical Interconnect Access) passing completely through platform segment 22. Typical uses for TSV 88 include three-dimensional die stacking, high input/output, and high bandwidth applications. TPV 90 is also a vertical electrical connection passing between or passing completely through one or more integrated electronic packages. TPV 90 can replace conventional edge wiring when creating three dimensional packages as well as providing for double-side mounting active circuits, logic, and memory in order to reduce package size. Typical uses for TPV 90 include three-dimensional system in package (SiP) and true heterogeneous integration applications.

Accordingly, the example of FIG. 3 is provided to demonstrate that an integrated electronic package can include multiple cavities each housing their respective electronic devices. The example of FIG. 3 is further provided to demonstrate that the material properties of platform segment 22 enable the inclusion of TSVs 88 and/or TPVs 90 and additional build up layers for three-dimensional applications.

Figure 4:
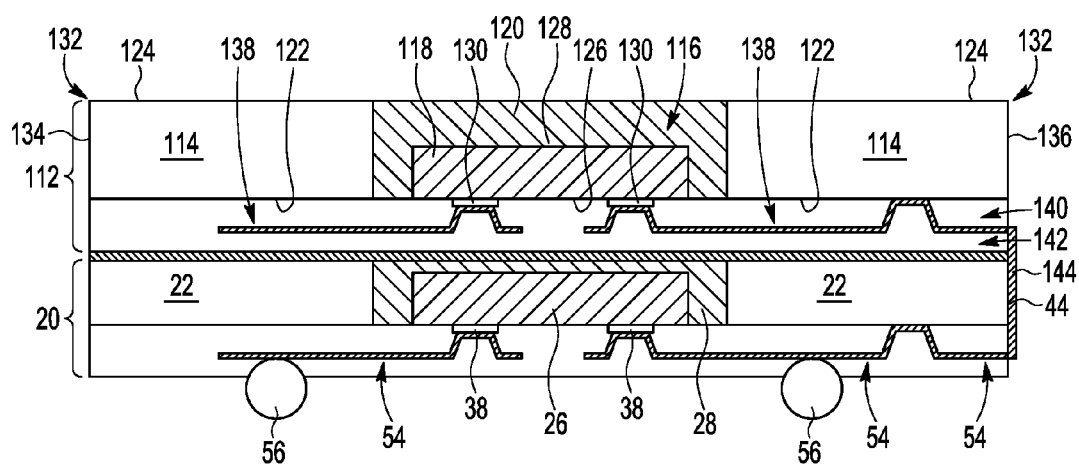
FIG. 4 shows a cross-sectional side view of a stacked integrated electronic package in accordance with yet another embodiment.

FIG. 4 shows a cross-sectional side view of a stacked integrated electronic package 110 in accordance with yet another embodiment. Integrated electronic package 110 represents a three-dimensional package in which integrated electronic package 20 and another integrated electronic package 112 are bonded to form a stacked configuration. Integrated electronic package 112 includes a platform segment 114 having at least one cavity 116 (of which only one is shown) extending through segment 114. Integrated electronic package 112 further includes at least one electronic device 118 (of which only one is shown) residing in cavity 116. Encapsulation material 120 fills cavity 116 and couples electronic device 118 to platform segment 114.

In the illustrated configuration, platform segment 114 has a first surface 122 and a second surface 124, opposing bottom surface 122. Electronic device 118 has an active side 126 and a back side 128 opposing active side 126. Electrical contacts 130 are located at active side 126 of electronic device 118. In general, active side 126 of electronic device 118 is approximately coplanar with bottom surface 122 of platform segment 114.

Active side 126 of electronic device 118 having electrical contacts 130 (e.g., bond pads) are exposed from encapsulation material 120. Additionally, bottom and top surfaces 122, 124 of platform segment 114 are exposed from encapsulation material 120. Likewise, portions 132 of platform segment 114 are exposed from encapsulation material 120 at opposing side walls 134, 136 of integrated electronic package 112.

Conductive interconnects 138 extend from electrical contacts 130 on active side 126 of electronic device 118 through a layered arrangement of insulating dielectric layers 140, 142 formed over active side 126 of electronic device 118 and bottom surface 122 of platform segment 114. In the example of FIG. 4, at least one of conductive interconnects 138 extends to side wall 136 of integrated electronic package 112. Similarly, for integrated electronic package 20, at least one of electrical interconnects 54 extends to side wall 44 of package 20. A conductive trace 144 is formed extending along side wall 44. Conductive trace 144 is coupled between electrical interconnect 54 at side wall 44 of integrated electronic package 20 and conductive interconnect 138 at side wall 136 of integrated electronic package 112 so as to electrically interconnect conductive trace 144 with electronic device 118. In such a manner, electronic device 26 of package 20 may be suitably electrically connected with electronic device 118 in accordance with a particular package design.

The exposed portions of respective platform segments 22 and 114, and more specifically, side walls 44 and 136, formed from a semiconductor material are significantly smoother than side walls formed from encapsulation material. This smoother surface enables more durable adhesion of conductive trace material 144 to exposed portions 40 and 132 of respective platform segments 22 and 114 than to prior art devices having side walls of exposed encapsulation material, thereby increasing process yield as compared to these prior art devices having side walls of exposed encapsulation material.

Figure 5:
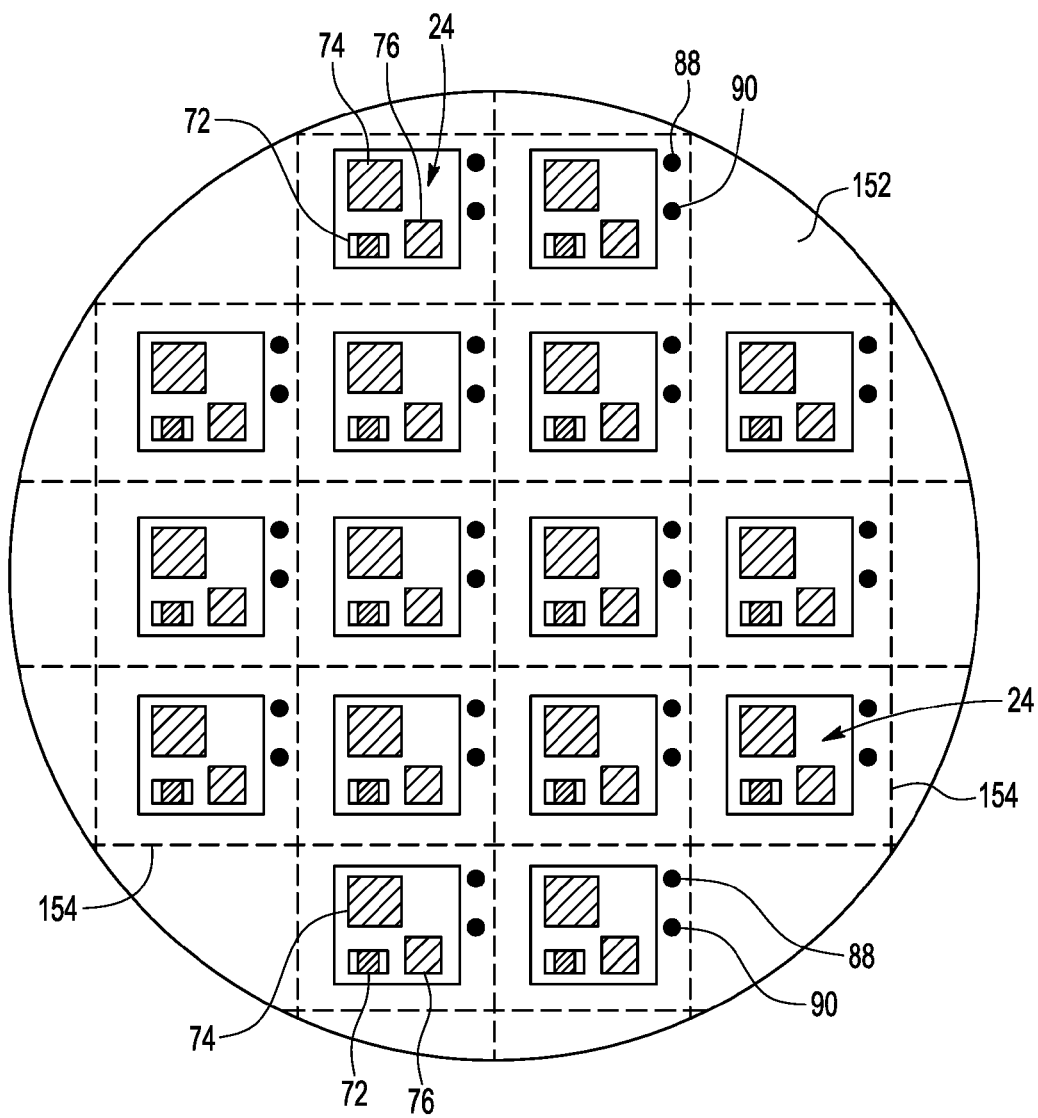
FIG. 5 shows a top view of a panel assembly that includes a platform structure and multiple electronic devices.

FIG. 5 shows a top view of a panel assembly 150 that includes a platform structure, in the form of a semiconductor wafer 152, multiple electronic devices 72, 74, 76 residing in multiple cavities 24, TSV 88 and TSV 90. In general, semiconductor wafer 152 is a grid structure of single crystal silicon that may be suitably processed to form cavities 24, TSV 88 and/or TSV 90. However, the platform structure may alternatively be formed from another semiconductor material, some of which were listed above. As shown for exemplary purposes, cavities 24 are sized to accommodate placement of electronic devices 72, 74, 76. Panel assembly 150 is not shown with encapsulation material 28 (FIG. 1) filling cavities 24 so as to highlight the placement of electronic devices 72, 74, and 76 within cavities 24.

Scribe lines 154, also known as saw streets, are demarcated on semiconductor wafer 152 by dashed lines. Scribe lines 154 represent the non-functional spacing on panel assembly 150 where a saw can safely cut panel assembly 150 without damaging electronic devices 72, 74, 76. Following processing, panel assembly 150 containing semiconductor wafer 152 is sawn, diced, drilled or otherwise separated to form a plurality of integrated electronic packages (such as packages 20, 70, 80, and 110, each containing a semiconductor wafer segment as discussed in connection with FIGS. 1-4). In a prior art panel assembly in which the panel is formed (i.e., reconstituted) using encapsulation material (i.e., mold compound), the width of the scribe lines is typically in the range of 200-300 microns to accommodate encapsulation material tear off during the sawing or laser drilling operation. This is due to the encapsulation material particulate size on the order of 30 to 50 microns and its corresponding roughness. In contrast, a crystal silicon semiconductor wafer 152 has a particle or grain size around 5 microns. Thus, crystal silicon semiconductor wafer 152 enables the width of scribe lines 154 to be in the range of 30 to 40 microns. Narrower scribe lines 154 allows for a greater number of integrated electronic packages per panel assembly 150 as compared to prior art panel assemblies in which the panel is formed (i.e., reconstituted) using encapsulation material (i.e., mold compound).

Figure 6:
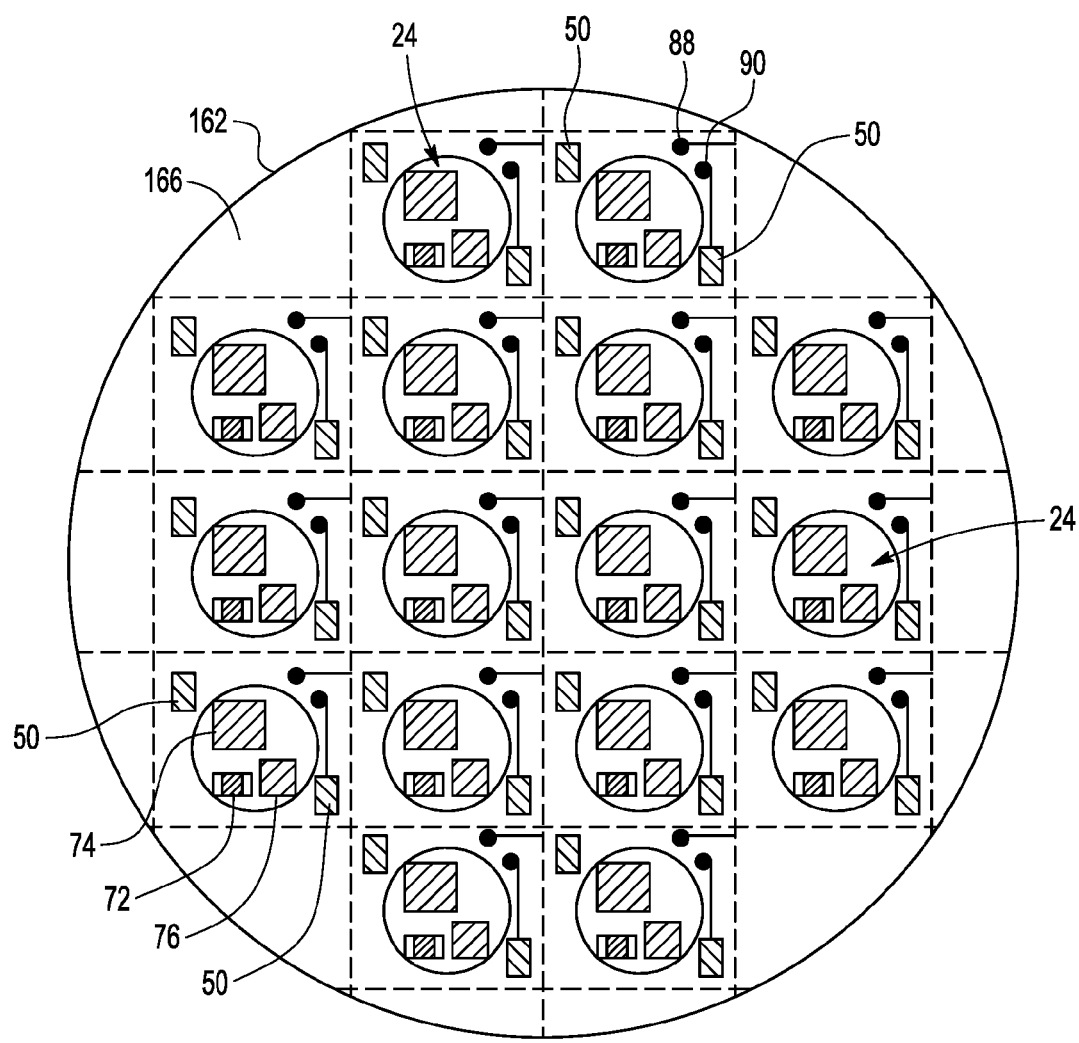
FIG. 6 shows a top view of a panel assembly that includes another platform structure and multiple electronic devices.

FIG. 6 shows a top view of a panel assembly 160 that includes another platform structure, in the form of a semiconductor wafer 162, multiple electronic devices 72, 74, 76 residing in multiple cavities 24, TSV 88 and TSV 90. As discussed previously, the platform structure may alternatively be formed from another semiconductor material. In the illustrated embodiment, metallization layer 50 is formed on a surface 166 of semiconductor wafer 162. Metallization layer 50 can be any combination of conductive traces, formed as an M0 (metal zero) layer on semiconductor wafer 162. Metallization layer 50 is simplistically illustrated using lines and shaded rectangles. Those skilled in the art will understand that the form and function of metallization layer 50 is dictated by a particular integrated electronic package design.

Semiconductor wafer 162 is a grid structure of single crystal silicon that may be suitably processed to form cavities 24, TSV 88, and/or TSV 90. Again cavities 24 are sized to accommodate placement of electronic devices 72, 74, 76. However, in this example, cavities 24 have a curvilinear shape. That is, cavities 24 are characterized by a curved line or path. More specifically in this example, cavities 24 are generally circular. The curvilinear shape of cavities 24 eliminates sharp corners in the single crystal silicon of semiconductor wafer 162, thereby reducing the potential for cracks forming during or following fabrication operations associated with semiconductor wafer 162. It should be understood that cavities 24 may have other shapes that eliminate sharp corners, such as generally rectangular cavities with rounded inside corners.

Figure 7:
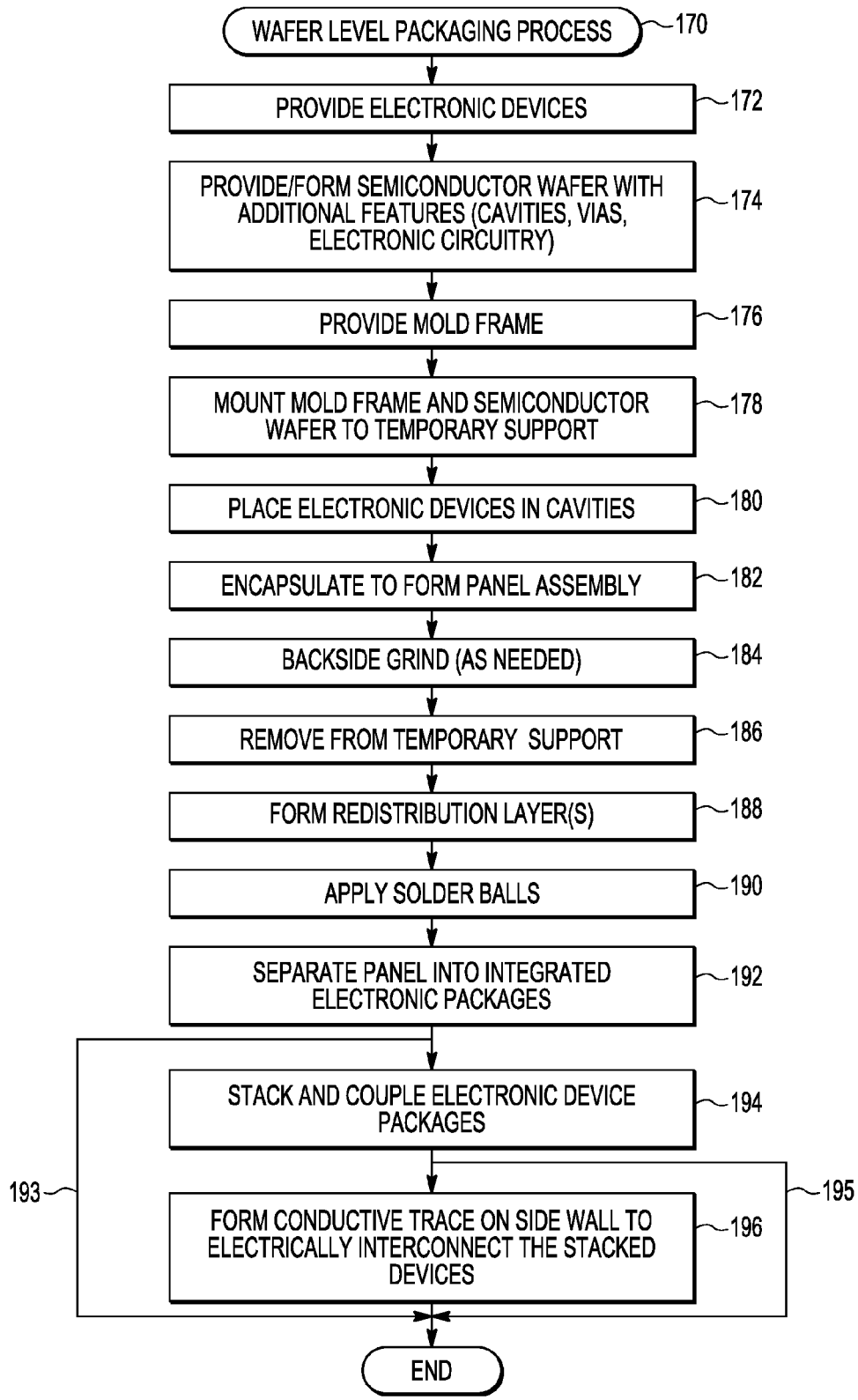
FIG. 7 shows a flowchart of a wafer level packaging process in accordance with another embodiment.

FIG. 7 shows a flowchart of a wafer level packaging process 170 in accordance with another embodiment. Wafer level packaging process 170 can be implemented to fabricate any of integrated electronic packages 20, 70, 80, 110 described in connection with FIGS. 1-4. Of course, wafer level package process 170 may be executed to fabricate a plurality of variations of integrated electronic packages, each containing a semiconductor wafer segment.

Process 170 includes providing (172) electronic devices (e.g., 24, 72, 74, 76 as discussed in connection with FIGS. 1-4), providing (174) or otherwise suitably processing a semiconductor wafer (e.g., 152 of FIG. 5 or 162 of FIG. 6) with additional features (e.g., cavities 24, 82, 84, 86, TSV 88 and/or TSV 90), and providing (176) a mold frame sized to accommodate the semiconductor wafer. The mold frame and semiconductor wafer are mounted (178) to a temporary support with the semiconductor wafer residing in the mold frame, and the electronic devices are placed (180) with their active sides facing the temporary support.

The semiconductor wafer and the electronic devices residing in the cavities are encapsulated (182) in a mold compound (e.g., encapsulation material 28, 120 as discussed in connection with FIGS. 1-4) to form a "reconstructed wafer" or panel assembly (e.g., 150, 160 as discussed in connection with FIGS. 5 and 6). Any gaps between electronic devices within each cavity and any gaps between the electronic devices and the surrounding semiconductor wafer are filled with the mold compound. The mold compound is then at least partially cured. A backside grind operation (184) may be performed to expose a surface of the semiconductor wafer (e.g., second surface 32 as discussed in connection with FIGS. 1-4). The panel assembly can then be removed (186) from the temporary support.

In an embodiment, one or more redistribution layers are formed (188) on the panel assembly. At step 188, the panel assembly is mounted onto a support carrier with the active side of the electronic devices oriented face up so that they are exposed. Formation of the redistribution layers can entail forming an M0 (metal zero) metallization layer, a dielectric layer over the exposed surface of the semiconductor wafer, the M0 metallization layer, and the active side of the electronic devices (e.g., deposition), forming openings in the dielectric layer (e.g., pattern) to the desired electrical contacts on the active side of the electronic devices, and forming the conductive interconnects over the dielectric layer (e.g., sputter and plate).

Those skilled in the art will understand that more than one insulating layer, more than one set of openings, and more than one conductive layer may be required to achieve the desired interconnections of electrical devices within the panel assembly. Thus, the above processes can be repeated as needed to get a desired layered arrangement of dielectric layers and conductive interconnects. The dielectric layer(s) may be deposited using any method which is compatible with fan-out wafer level packaging processing including, but not limited to, spin-coating, lamination, or printing. The fan-out wafer level packaging process is compatible with a variety of dielectric deposition methods, and as such, embodiments are not limited by the method employed. Additionally, the fan-out wafer level packaging process is not dependent upon the methodology and materials used to form the conductive interconnects. As such, specific details will not be discussed herein for brevity.

In an embodiment, the package contacts (e.g., conductive elements 56 of FIGS. 1-4) are applied (190) over the layered arrangement of dielectric layers and conductive interconnects (i.e., the redistribution layers). The package contacts may be solder balls that are applied onto the exposed electrical contacts of the conductive interconnects using automated equipment. The panel assembly can then be separated (192) into a plurality of integrated electronic packages. This can be done using methods known in the industry, for example, using any of a variety of wafer sawing or dicing techniques. The now singulated integrated electronic packages may be useful as-is and in such an embodiment wafer level packaging process 170 can optionally proceed to END, as exemplified by a path 193.

Alternatively, process 170 can proceed in a further embodiment to form a stacked integrated electronic package (e.g., package 110 of FIG. 4) by stacking and coupling (194) the electronic packages (e.g., integrated electronic packages 20, 112 of FIG. 4). This is done using known bonding techniques and materials. The stacked and coupled integrated electronic packages may be useful as-is and in such an embodiment wafer level packaging process 170 can optionally proceed to END, as exemplified by a path 195.

Alternatively, process 170 can proceed in a further embodiment to electrically interconnect electronic devices within each of the integrated electronic packages to one another. That is, a conductive trace (e.g., conductive trace 144 of FIG. 4) is formed (196) on one of the side walls of the stacked integrated electronic packages to electrically interconnect certain electronic devices within each of the integrated electronic packages. Thereafter, wafer level packaging process 170 proceeds to END. Of course, post processing may be performed following step 196 including, for example, testing, attachment to a printed circuit board, and so forth. The specific details of the post processing activities are not described herein for brevity.

The subsequent FIGS. 8-20 and the following description demonstrate various operations that may be performed in connection with the execution of wafer level packaging process 170 (FIG. 7). Hence, wafer level packaging process 170 should be reviewed concurrent with the following discussion of FIGS. 8-20.

Figure 8:
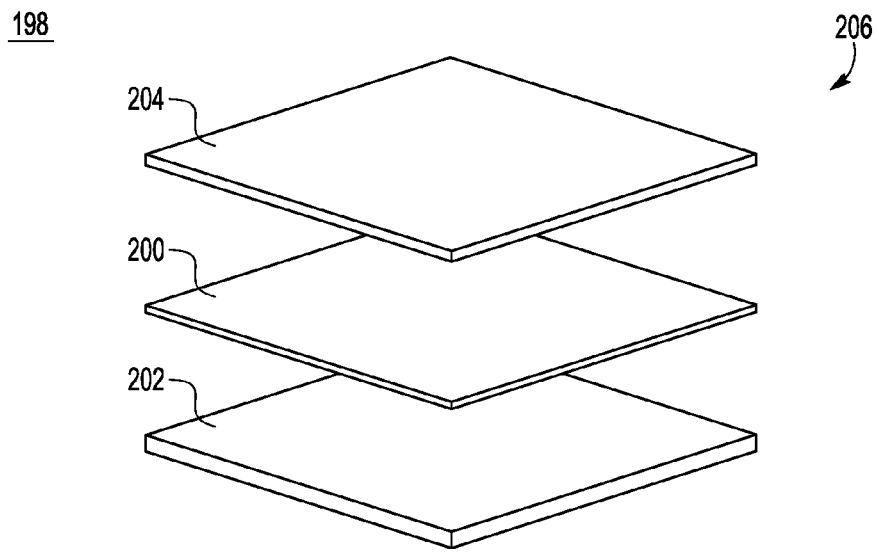
FIG. 8 shows a simplified perspective view exemplifying a structure at an initial stage of the wafer level packaging process of FIG. 7.

FIG. 8 shows a simplified perspective view exemplifying a structure at an initial stage 198 of execution of wafer level packaging process 170. At initial stage, a tape 200 can be applied to a substrate 202. Tape 200 is oriented so that an adhesive side is facing substrate 202. A double-sided tape 204 may be applied to tape 200. The combination of substrate 202, tape 200, and double-sided tape 204 forms a temporary support 206. Substrate 202 may be glass ceramic, metal, or any other suitable material. Adhesion to substrate 202 can be achieved using thermal release tapes, silicone adhesives, or other temporary bonding media.

Figure 9:
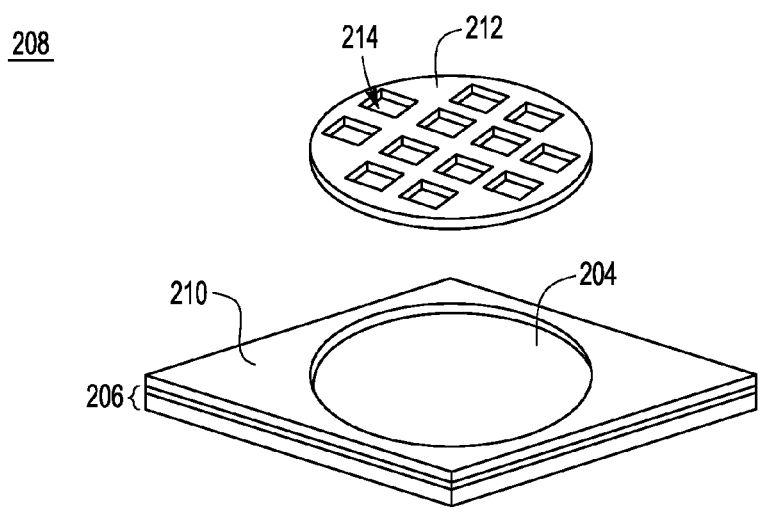
FIG. 9 shows a simplified perspective view exemplifying a structure at a subsequent stage of the wafer level packaging process.

FIG. 9 shows a simplified perspective view exemplifying a structure at a subsequent stage 208 of wafer level packaging process 170, and particularly at steps 176, 178 (FIG. 7). At stage 208, a mold frame 210 may be mounted to temporary support 206. Additionally, a platform structure such as a semiconductor wafer 212 is mounted to temporary support 206 within mold frame 210. Semiconductor wafer 212 is provided with cavities 214, and can be provided with through-silicon vias 88, and through-package vias 90 (discussed in connection with FIGS. 1-4). Mold frame 210 and semiconductor wafer 212 adheres to double-sided tape 204 of temporary support 206.

Figure 10:
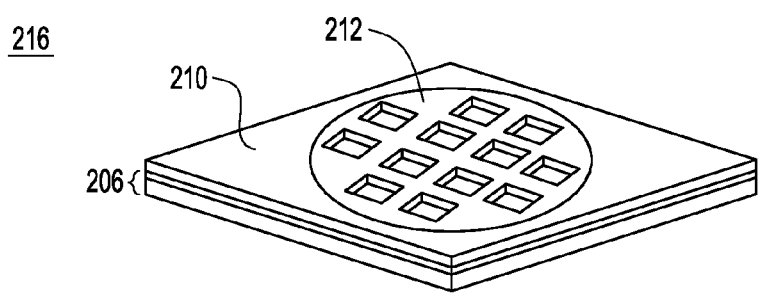
FIG. 10 shows a simplified perspective view exemplifying a structure at a subsequent stage of the wafer level packaging process.

FIG. 10 shows a simplified perspective view exemplifying a structure at a subsequent stage 216 of wafer level packaging process 170. At stage 216, semiconductor wafer 212 is shown mounted to temporary support 206 within mold frame 210. Although a mold frame is described herein, it should be understood that a mold frame may not be utilized in an alternative packaging process. For example, semiconductor wafer 212 may be mounted to temporary support 206, which can subsequently be encapsulated to fill cavities 214. In such a process, semiconductor wafer 212 would act as a type of mold frame, and would thus need to be greater than or equal to the height of the thickest electronic device to be placed in cavities 214.

Figure 11:
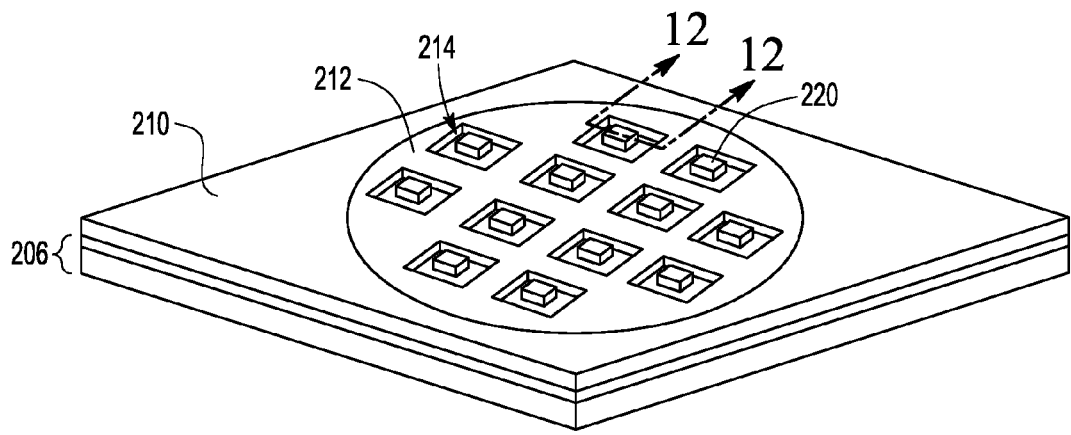
FIG. 11 shows a simplified perspective view exemplifying a structure at a subsequent stage of the wafer level packaging process.
Figure 12:
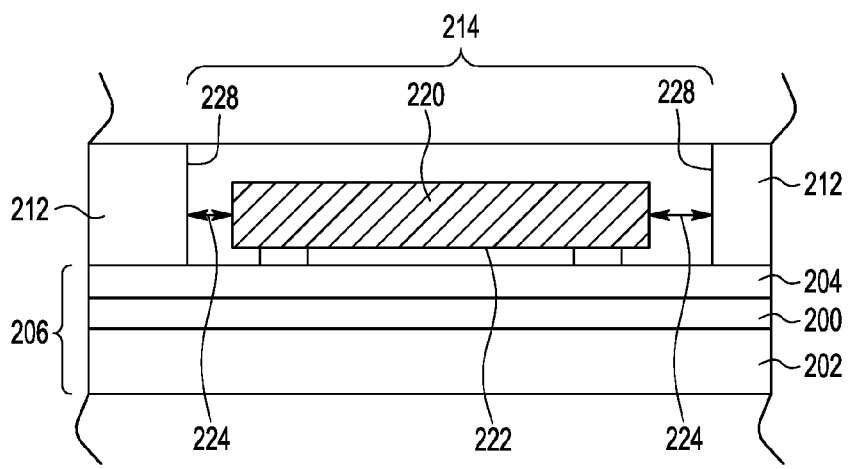
FIG. 12 shows a side view of the structure of FIG. 11 along section lines 12-12 shown in FIG. 11.

Referring to FIGS. 11-12, FIG. 11 shows a simplified perspective view exemplifying a structure at a subsequent stage 218 of the wafer level packaging process 170, and more particularly at step 180 (FIG. 7), and FIG. 12 shows a side view of the structure of FIG. 11 along section lines 12-12 shown FIG. 11. At stage 218, electronic devices 220 are placed in cavities 214 of semiconductor wafer 212. Electronic devices 220 are placed in cavities 214 with an active side 222 of each electronic device 220 facing temporary support 206 and adhered to double-sided silicon tape 204. Cavities 214 are sized to accommodate electronic devices 220. However, gaps 224 may be located between device edges 226 of electronic devices 220 and wafer edges 228 of semiconductor wafer 212 (best seen in FIG. 12).

Figure 13:
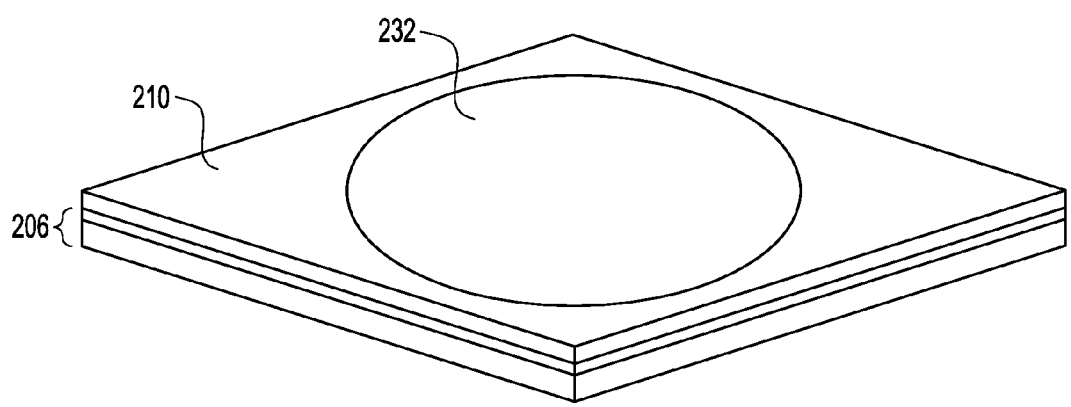
FIG. 13 shows a simplified perspective view exemplifying a structure at a subsequent stage of the wafer level packaging process.
Figure 14:
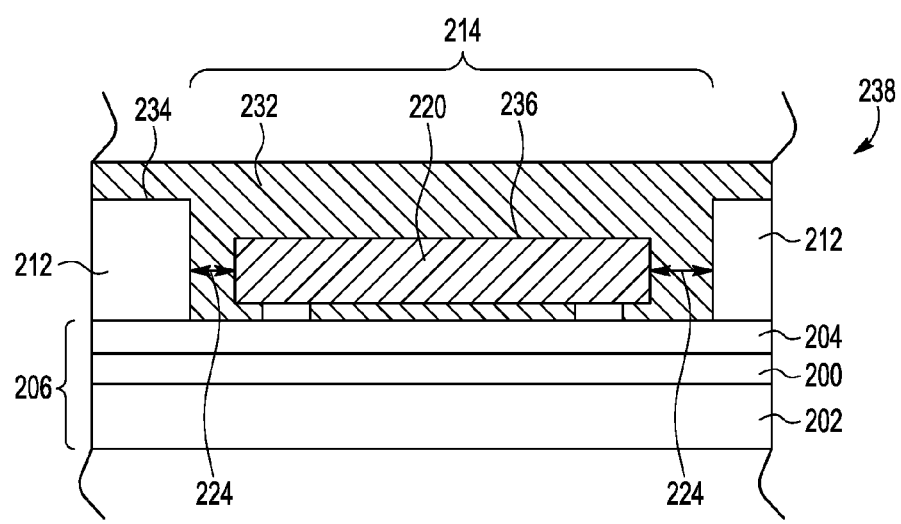
FIG. 14 shows a partial side view of the structure of FIG. 13.

Referring to FIGS. 13-14, FIG. 13 shows a simplified perspective view exemplifying a structure at a subsequent stage 230 of wafer level packaging process 170, and more particularly at step 182 (FIG. 7), and FIG. 14 shows a partial side view of the structure of FIG. 13. At stage 230, an encapsulation material 232 (e.g., mold compound) can be applied over a surface 234 of semiconductor wafer 212 and a back side 236 of electronic devices 220. Encapsulation material 232 desirably fills gaps 224 to secure electronic devices 220 within cavities 214. In accordance with known processes, encapsulation material 232 may be screen printed onto semiconductor wafer 212 and electronic devices 220. In accordance with alternative processes, encapsulation material 232 may be applied via dispense technique injection molding, transfer molding, and the like. After application, the encapsulation material 232 may undergo a devoiding process to remove air at locations at which encapsulation material 232 is absent. Thereafter, the structure including encapsulation material 232 may be cured to partially harden encapsulation material 232 to a state suitable for back side grinding in accordance with backside grind step 184 of wafer level packaging process 170 (FIG. 7).

Figure 15:
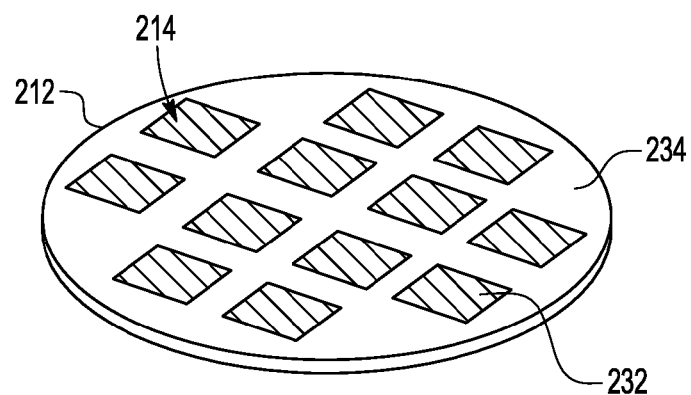
FIG. 15 shows a simplified perspective view of a panel assembly formed in accordance with the wafer level packaging process.

With continued reference to FIG. 14 in connection with FIG. 15, FIG. 15 shows a simplified perspective view of a panel assembly 238 formed in accordance with wafer level packaging process 170. More particularly, FIG. 15 shows panel assembly 238 following backside grind step 184 (FIG. 7) which exposes surface 234 of semiconductor wafer 212, and following removal of panel assembly 238 from temporary support 206 (FIG. 13) in accordance with step 186 (FIG. 7). In some embodiments, mold frame 210 (FIG. 13) may be removed from temporary support 206 and panel assembly 238 may be back ground to a desired thickness so as to expose surface 234 of semiconductor wafer 212. Note that even after backgrinding, cavities 214 remain filled such that electronic devices 220 remain embedded within encapsulation material 232. Thereafter, panel assembly 238 may be released from glass substrate 202 and double-sided tape 204 may then be peeled from panel assembly 238. Additional processing may entail curing encapsulation material 232 by heating panel assembly 238, exposing panel assembly 238 to ultraviolet radiation (UV cure), or performing any other suitable cure process to fully harden encapsulation material 232.

FIGS. 16-19, discussed below, exemplify operations that can occur in accordance with step 188 (FIG. 7) of wafer level packaging process 170 during which redistribution layers are formed over panel assembly 238.

Figure 16:
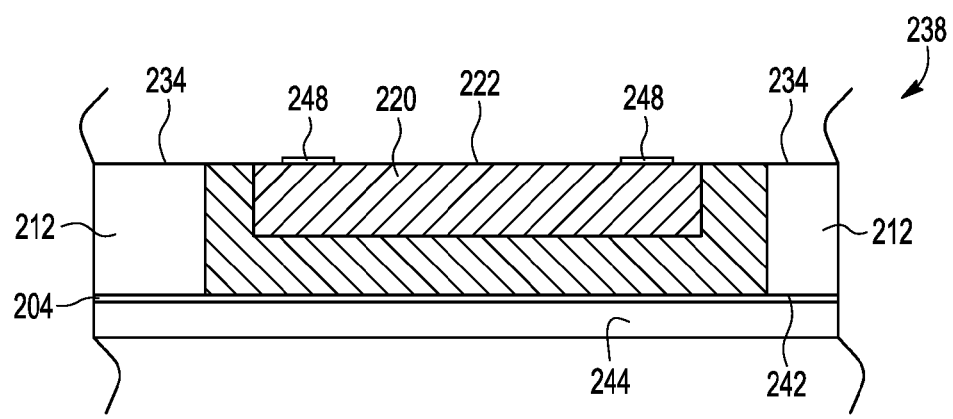
FIG. 16 shows a partial side view of the panel assembly of FIG. 15 at a subsequent stage of processing.

FIG. 16 shows a partial side view of panel assembly 238 at a subsequent stage 240 of processing in accordance with step 188 of wafer level packaging process 170. At stage 240, a back side 242 of panel assembly 238 may be attached to a back-side support carrier 244 using, for example, double-sided silicon tape 204. Accordingly, a surface 234 of semiconductor wafer 212 and active side 222 of electronic devices 220 having electrical contacts 248 are exposed. In some processes, surface 234 of semiconductor wafer 212 and active side 222 of electronic devices 220 may be cleaned to remove possible residue from electrical contacts 248.

Figure 17:
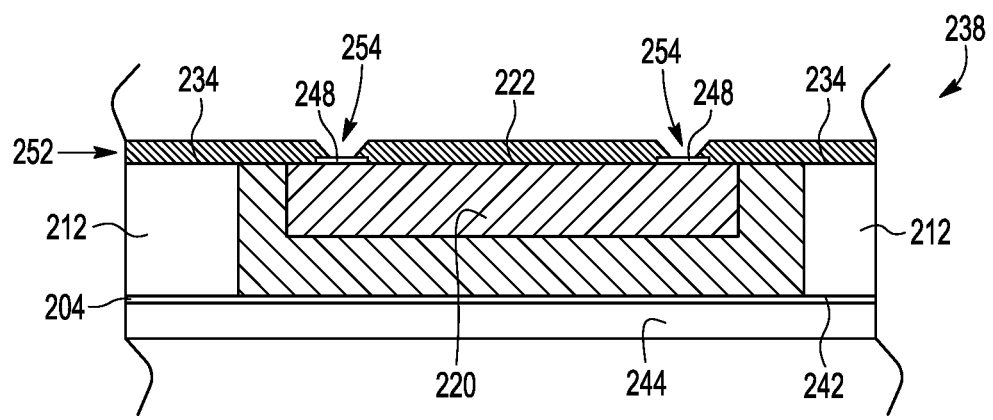
FIG. 17 shows a partial side view of the panel assembly from FIG. 16 at a subsequent stage of processing.

FIG. 17 shows a partial side view of panel assembly 238 from FIG. 16 at a subsequent stage 250 of processing in accordance with step 188 (FIG. 7) of wafer level packaging process 170. At stage 250, a dielectric layer 252 may be applied over surface 234 of semiconductor wafer 212 and active side 222 of electronic devices 220 of panel assembly 238 using, for example, a spin coat dielectric deposition process, a dispense process, an screen printing process, and the like. Openings 254 may be formed in dielectric layer 252 using a suitable etch process in order to expose electrical contacts 248 from dielectric layer 252. Thereafter, dielectric layer 252 may undergo a suitable cure process.

Figure 18:
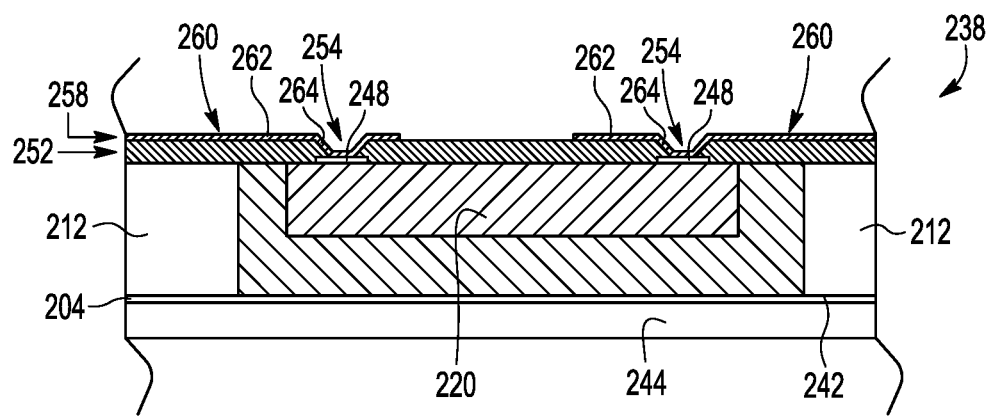
FIG. 18 shows a partial side view of the panel assembly from FIG. 17 at a subsequent stage of processing.

FIG. 18 shows a partial side view of panel assembly 238 from FIG. 17 at a subsequent stage 256 of processing in accordance with step 188 (FIG. 7) of wafer level packaging process 170. At stage 256, openings 254 may be suitably cleaned, a seed layer for a first conductive layer may be formed by a sputtering process, and a resist pattern for the first conductive layer may be formed over the seed layer in accordance with known methodologies. Thereafter, a first conductive layer 258 may be formed over dielectric layer 252 using, for example, an electroplating process. The resist material is suitably removed so that conductive interconnects 260 having conductive traces 262 and conductive vias 264 in electrical communication with electrical contacts 248 remain.

Figure 19:
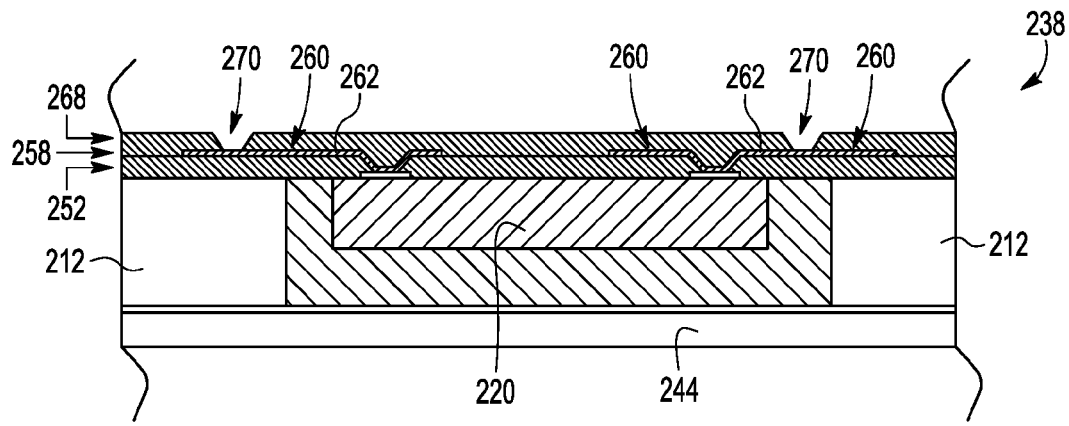
FIG. 19 shows a partial side view of the panel assembly from FIG. 18 at a subsequent stage of processing.

FIG. 19 shows a partial side view of panel assembly 238 from FIG. 18 at a subsequent stage 266 of processing in accordance with step 188 of wafer level packaging process 170. At stage 266, another dielectric layer 268 may be applied over conductive interconnects 260 of first conductive layer 258 and any exposed regions of dielectric layer 252 using, for example, a spin coat dielectric deposition process. Again, openings 270 may be formed in dielectric layer 268 using a suitable etch process in order to expose traces 262 of conductive interconnects 260 at predetermined locations from dielectric layer 268. Thereafter, dielectric layer 268 may undergo a suitable cure process.

Only a single conductive layer 258 and two dielectric layers 252, 268 are described in connection with FIGS. 17-19. However, it should be understood that the operations demonstrated in FIGS. 17-19 may be repeated to obtain a predetermined layered arrangement and geometry of dielectric layers and conductive interconnects.

Figure 20:
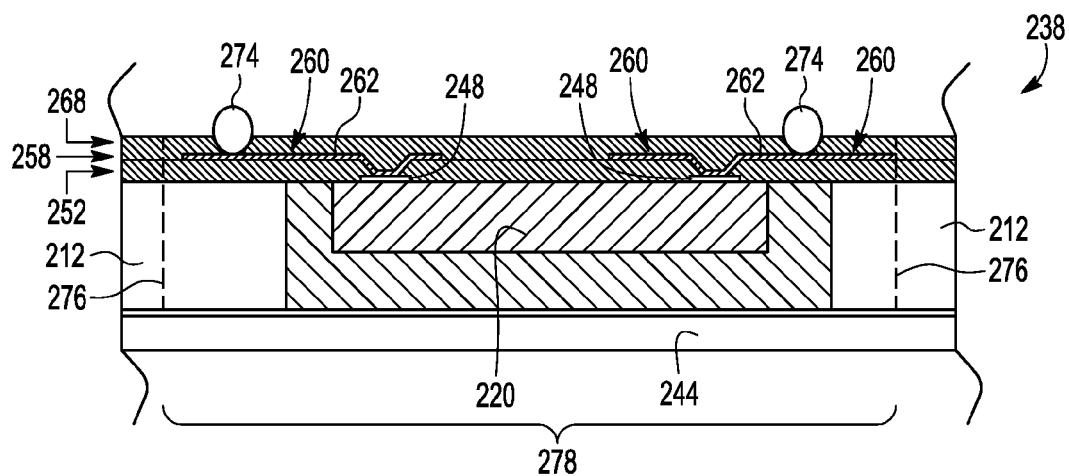
FIG. 20 shows a partial side view of the panel assembly from FIG. 19 at a subsequent stage of processing.

FIG. 20 shows a partial side view of panel assembly 238 at a subsequent stage 272 of processing in accordance with step 190 of wafer level packaging process 170. At stage 272, conductive elements in the form of, for example, solder balls 274 are formed at opening 270 of the outermost dielectric layer 268 and are suitably electrically connected with conductive interconnects 260 to provide input/output capability for electrical contacts 248 on electronic devices 220. Solder balls 274 may be formed using a solder mask application process and by a solder print or a sphere attach process. Thereafter, panel assembly 238 may be detached from back-side support carrier 244, cleaned, mounted, and sawn or diced along scribe lines 276 into multiple integrated electronic packages 278 in accordance with step 192 of wafer level packaging process 170.

It is to be understood that certain ones of the process blocks depicted in FIG. 7 and demonstrated in connection with FIGS. 8-20 may be performed in parallel with each other or with performing other processes. In addition, it is to be understood that the particular ordering of the process blocks depicted in FIG. 7 may be modified, while achieving substantially the same result. Accordingly, such modifications are intended to be included within the scope of the inventive subject matter. In addition, although package configurations are described in conjunction with FIGS. 1-4 above, embodiments may be implemented in packages having other architectures, as well. These and other variations are intended to be included within the scope of the inventive subject matter.

For simplicity and clarity of illustration, the drawing figures illustrate the general manner of construction. Descriptions and details of well-known features and techniques may be omitted to avoid unnecessarily obscuring the invention. Additionally, elements in the drawings figures are not necessarily drawn to scale. For example, the dimensions of some of the elements or regions in some of the figures may be exaggerated relative to other elements or regions of the same or other figures to help improve understanding of embodiments of the invention. Furthermore, different elements may be illustrated variously to include hatching, stippling, or some other pattern in order to more clearly distinguish the elements from one another.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation or use in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The terms "left," "right," "in," "out," "front," "back," "up," "down," "top," "bottom," "over," "under," "above," "below," and the like in the description and the claims, if any, are used for describing relative positions and not necessarily for describing permanent positions in space. It is to be understood that the embodiments of the invention described herein may be used, for example, in other orientations than those illustrated or otherwise described herein. The term "coupled," as used herein, is defined as directly or indirectly connected in an electrical or non-electrical manner.

Various embodiments of a method of wafer level packaging and integrated electronic packages produced via the wafer level packaging methodology have been described. A panel assembly of electronic devices is formed that includes an embedded semiconductor wafer. The embedded semiconductor wafer serves to limit warpage of the panel assembly during encapsulation relative to a panel assembly made of mold compound in order to increase package yield and decrease manufacturing complexity during a subsequent build up process. Furthermore, the incorporation of a semiconductor wafer, such as a silicon wafer, can reduce material costs as well as manufacturing and tooling costs, and can reduce the rate of wear of the saw blade during package singulation due to the softness of the semiconductor wafer relative to the use of a copper EGP. Additionally, the implementation of an embedded semiconductor wafer in the panel assembly can achieve reduced thermal expansion, hence better die drift performance, relative to the use of a copper EGP. And still further, the semiconductor wafer embedded in the panel assembly can be used as a platform for a redistribution process and/or for forming through silicon vias.

While the principles of the inventive subject matter have been described above in connection with specific apparatus and methods, it is to be clearly understood that this description is made only by way of example and not as a limitation on the scope of the inventive subject matter. Further, the phraseology or terminology employed herein is for the purpose of description and not of limitation.

The foregoing description of specific embodiments reveals the general nature of the inventive subject matter sufficiently so that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. An integrated electronic package comprising:
   a platform segment having a cavity extending through said platform segment, said platform segment having a first surface and a second surface opposing said first surface, said platform segment comprising a semiconductor material;
   a first electronic device residing in said cavity, said first electronic device having first active side at which first electrical contacts are located and a back side opposing said active side, wherein said active side is approximately coplanar with said first surface of said platform segment;
   a second electronic device residing in said cavity and laterally displaced from said first electronic device, said second electronic device having a second active side at which second electrical contacts are located, wherein said second active side is approximately coplanar with said first surface of said platform segment; and
   encapsulation material in said cavity, said encapsulation material coupling said first and second electronic devices to said platform segment, wherein said first and second active sides of said first and second electronic devices are exposed from said encapsulation material and said first and second surfaces of said platform segment are exposed from said encapsulation material.

2. The integrated electronic package of claim 1 wherein said platform segment comprises a portion of a silicon crystal wafer.

3. The integrated electronic package of claim 1 wherein said platform segment has a thickness that is greater than a height of said first electronic device.

4. The integrated electronic package of claim 3 wherein said back side of said first electronic device residing in said cavity is embedded in said encapsulation material.

5. The integrated electronic package of claim 1 further comprising a metallization layer formed directly on a non-cavity area of said platform segment.

6. The integrated electronic package of claim 1 further comprising a conductive via extending through said platform segment at a non-cavity area of said platform segment.

7. The integrated electronic package of claim 6 further comprising:
   at least one insulating layer formed over said non-cavity area of said second surface of said platform segment;
   an opening formed in said at least one insulating layer to expose said conductive via; and
   a conductive interconnect extending through said opening in said at least one insulating layer and in electrical contact with said conductive via, said conductive interconnect extending over said non-cavity area of said platform segment.

8. The integrated electronic package of claim 1 further comprising:
   at least one insulating layer formed over said active side of said first electronic device and over a non-cavity area of said platform segment;
   an opening formed in said at least one insulating layer to expose one of said electrical contacts on said active side of said first electronic device; and
   a conductive interconnect extending through said opening in said at least one insulating layer and extending over said non-cavity area of said platform segment.

9. The integrated electronic package of claim 8 wherein said conductive interconnect extends to and is exposed at a side wall of said integrated electronic package.

10. An integrated electronic package comprising:
    a platform segment having a cavity extending through said platform segment, said platform segment having a first surface and a second surface opposing said first surface, said platform segment comprising a semiconductor material;

an electronic device residing in said cavity, said electronic device having an active side at which electrical contacts are located and a back side opposing said active side, wherein said active side is approximately coplanar with said first surface of said platform segment; and encapsulation material in said cavity, said encapsulation material coupling said electronic device to said platform segment, wherein said active side of said electronic device is exposed from said encapsulation material and said first and second surfaces of said platform segment are exposed from said encapsulation material;

at least one insulating layer formed over said active side of said electronic device and over a non-cavity area of said platform segment;

an opening formed in said at least one insulating layer to expose one of said electrical contacts on said active side of said electronic device;

a conductive interconnect extending through said opening in said at least one insulating layer and extending over said non-cavity area of said platform segment, wherein said conductive interconnect extends to and is exposed at a side wall of said integrated electronic package; and a conductive trace extending along said side wall, said conductive trace being in electrical communication with said conductive interconnect.

11. A stacked assembly comprising the integrated electronic package of claim 10 and a second integrated electronic package bonded with said integrated electronic package, said second integrated electronic package having a second conductive interconnect in electrical communication with said conductive trace.

12. A stacked assembly comprising:
a first integrated electronic package including:
a platform segment having a cavity extending through said platform segment, said platform segment having a first surface and a second surface opposing said first surface, said platform segment comprising a semiconductor material;
a first electronic device residing in said cavity, said electronic device having an active side at which electrical contacts are located and a back side opposing said active side, wherein said active side is approximately coplanar with said first surface of said platform segment;
encapsulation material in said cavity, said encapsulation material coupling said electronic device to said platform segment, wherein said active side of said electronic device is exposed from said encapsulation material and said first and second surfaces of said platform segment are exposed from said encapsulation material;
at least one insulating layer formed over said active side of said first electronic device and over a non-cavity area of said platform segment;
an opening formed in said at least one insulating layer to expose one of said electrical contacts on said active side of said at least one electronic device; and
a first conductive interconnect extending through said opening in said at least one insulating layer and extending over said non-cavity area of said platform segment, wherein said first conductive interconnect extends to and is exposed at a side wall of said first integrated electronic package;
a second integrated electronic package bonded with said first integrated electronic package, said second integrated electronic package including a second conductive interconnect; and
a conductive trace extending along said side wall, said conductive trace being in electrical communication with each of said first and second conductive interconnects.

13. The stacked assembly of claim 12 wherein said second integrated electronic package comprises:
a second platform segment having a second cavity extending through said second platform segment, said platform segment having a third surface, said second platform segment comprising a semiconductor material;
a second electronic device residing in said second cavity, said second electronic device having a second active side at which second electrical contacts are located, wherein said second active side is approximately coplanar with said third surface of said second platform segment;
at least one insulating layer formed over said third surface of said second platform segment;
a second opening formed in said at least one insulating layer to expose one of said second electrical contacts, wherein said second conductive interconnect extends through said second opening in said at least one insulating layer and is electrical contact with said second electrical contact.

14. The stacked assembly of claim 13 wherein said second conductive interconnect extends to and is exposed at a second side wall of said second integrated electronic package.

15. The stacked assembly of claim 13 wherein said at least one insulating layer formed over said third surface of said second platform segment and said second conductive interconnect are interposed between said first integrated electronic device and said second platform segment and said second electronic device of said second integrated electronic package.

* * * * *